United States Patent
Feudel et al.

(10) Patent No.: US 6,846,708 B2
(45) Date of Patent: Jan. 25, 2005

(54) SEMICONDUCTOR DEVICE HAVING IMPROVED DOPING PROFILES AND A METHOD OF IMPROVING THE DOPING PROFILES OF A SEMICONDUCTOR DEVICE

(75) Inventors: Thomas Feudel, Radebeul (DE);
Manfred Horstmann, Dresden (DE);
Rolf Stephan, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 18 days.

(21) Appl. No.: 10/601,717

(22) Filed: Jun. 23, 2003

(65) Prior Publication Data

US 2004/0137687 A1 Jul. 15, 2004

(30) Foreign Application Priority Data

Dec. 30, 2002 (DE) .......................................... 102 61 374

(51) Int. Cl.[7] .......................... H01L 21/00; H01L 21/84; H01L 21/336
(52) U.S. Cl. ........................ 438/162; 438/303; 438/305
(58) Field of Search ................................. 438/162, 303, 438/305, 301, 520, 525, 302

(56) References Cited

U.S. PATENT DOCUMENTS

| 5,885,886 A | 3/1999 | Lee ............................ 438/528 |
| 6,268,640 B1 * | 7/2001 | Park et al. ................... 438/303 |
| 6,593,623 B1 * | 7/2003 | Sultan ......................... 257/344 |

* cited by examiner

Primary Examiner—John F. Niebling
Assistant Examiner—Walter L. Lindsay, Jr.
(74) Attorney, Agent, or Firm—Williams, Morgan & Amerson, P.C.

(57) ABSTRACT

An implanting process for amorphizing a crystalline substrate is proposed according to the present invention. In particular, according to the present invention, amorphous regions are formed in a substrate by exposing the substrate to an ion beam which is kept at a tilt angle between 10 and 80 degrees with respect to the surface of the substrate. Accordingly, ion channeling during subsequent implanting processes is prevented not only in the vertical direction but also in the horizontal direction so that doped regions exhibiting optimum doping profile tailoring may be realized.

28 Claims, 5 Drawing Sheets

SEMICONDUCTOR DEVICE HAVING IMPROVED DOPING PROFILES AND A METHOD OF IMPROVING THE DOPING PROFILES OF A SEMICONDUCTOR DEVICE

BACKGROUND OF THE INVENTION

1. Field of the Invention

The present invention relates to the fabrication of integrated circuits, and, more particularly, to the implanting of ions of dopant materials into workpieces and/or substrates suitable for the fabrication of integrated circuits. More specifically, the present invention relates to a method of amorphizing a crystalline substrate on which integrated circuits are fabricated.

2. Description of the Related Art

In the last several years, the numbers of circuit elements manufactured on semiconductor substrates has continuously grown, and the size of the circuit elements has continuously decreased accordingly. Presently, circuit elements are commonly fabricated featuring minimum sizes less than 0.18 $\mu$m and the progress in the manufacturing technology seems likely to continue to proceed in this manner.

However, in the case of field effect transistors, as process technology improved to the point where devices could be fabricated with a gate length less than 2 $\mu$m, the need arose to restrict the doping profiles of the several implants carried out during the manufacturing process to shallow locations. That is, implantations need to be confined within shallow well predefined regions. To obtain the shallow doping profiles required for, e.g., halo structures, source/drain regions and channels, all physical mechanisms allowing dopants to penetrate into the substrate must be strictly controlled or eliminated. In particular, the principal factor to be controlled is ion channeling.

To accomplish this end, great efforts have been made and several measures have been taken in the art. Among these measures, common manufacturing processes often use a so-called "pre-amorphization" implantation step before carrying out the usual dopant implantation steps. In particular, an amorphous zone is usually formed during a first pre-amorphization implantation and, during subsequent implantation processes, the doped regions (halo and source/drain extension regions) are formed. Normally, heavy inert ions like germanium or xenon are implanted at an implant energy of approximately 80–200 keV to fully amorphize the surface regions of the substrate.

In the following, a description will be given with reference to FIGS. 1a–1d of a typical prior art process for forming the active regions of a field effect transistor, including a typical "pre-amorphization" implanting step, as well as a typical "halo" implanting step and the implanting steps for forming the source and drain regions.

FIG. 1a schematically shows a MOS transistor 100 to be formed on a substrate 1, such as a silicon wafer. Isolation structures 2 define an active region of the transistor 100. Moreover, reference 3 relates to a polysilicon gate electrode of the MOS transistor 100. Reference 6 denotes a gate insulation layer. Reference 7a relates to an ion beam to which the substrate 1 is exposed during a "pre-amorphization" implanting process, and reference 5a relates to amorphous regions formed into the substrate 1.

In FIGS. 1b–1d, those parts already described with reference to FIG. 1a are identified by the same reference numerals. In addition, in FIG. 1b, reference 7h relates to an ion beam to which the substrate 1 is exposed for forming the halo regions 5h. The dopant material implanted during such a process is of the same type as the dopant used for doping the substrate. That is, the halo implants for NMOS and PMOS devices are performed using a P-type and an N-type dopant material, respectively. In a sense, the halo implants reinforce the dopants in the substrate.

In FIG. 1c, reference 7e relates to an ion beam to which the substrate 1 is exposed for forming the source/drain extension regions of the transistor 100. Moreover, references 5'S and 5'D relate to the source extension region and the drain extension region, respectively, of the transistor 100. Still, in FIG. 1c, reference e relates to a portion of the transistor 100 which is depicted in enlarged view in FIG. 1c', in which corresponding reference numerals identify corresponding parts already described with reference to FIG. 1c.

In FIG. 1d, reference 4 relates to dielectric sidewall spacers formed on the sidewalls of the polysilicon line 3 and references 5S and 5D relate to the source and drain regions, respectively, after a further heavy implantation step has been carried out for determining the final concentration of dopants in the source and drain regions. Finally, in FIG. 1d, reference 7SD identifies an ion beam to which the substrate 1 is exposed for forming the source and drain regions 5S and 5D.

A typical process flow for forming the active regions of the transistor 100 comprising the amorphous regions 5a, the halo structures 5h and the source and drain regions 5S and 5D may include the following steps.

Following the formation of the gate insulation layer 6 and the overlying polysilicon line 3 according to well-known lithography and etching techniques, the amorphous regions 5a are formed during a first pre-amorphization implantation step (see FIG. 1a). To this end, the substrate 1 is exposed to the ion beam 7a and heavy ions, such as phosphorous, arsenic and argon are implanted into the substrate at an implanting energy of about 80 keV. The ion beam 7a is normally kept perpendicular or at a weak tilt angle (up to 10 degrees) with respect to a direction perpendicular to the surface of the substrate 1.

It has been observed that at a predefined implanting dose, local amorphous regions are created by the ions penetrating into the substrate, which eventually overlap until a continuous amorphous layer is formed. This amorphous layer (or the amorphous regions 5a) is formed with the purpose of controlling ion channeling during the next implanting steps so as to obtain shallow implanting profiles for both the halo regions and the source and drain regions to be formed in a substrate. That is, the implanted ions do not penetrate in an amorphous layer as deeply as in a crystalline layer so that the implanted ions can be confined to shallower regions and the actual doping profile and final dopant concentration of those regions implanted after the pre-amorphization implantation step can be better controlled. However, due to the fact that the amorphous regions 5a are formed with a non- or weakly-tilted implantation beam, only the vertical penetration depth of subsequent doping profiles can be reduced.

In a next step, as depicted in FIG. 1b, the halo regions 5h of the transistor 100 are formed. In particular, a further ion implantation step is carried out during which the substrate is exposed to an ion beam 7h. As depicted in FIG. 1b, during the depicted halo implant, the ion beam 7h is kept perpendicular with respect to the surface of the substrate 1 or the ion beam 7h is weakly tilted (up to 10 degrees) with respect to a direction perpendicular to the surface of the substrate 1. The dopant concentration in the regions 5h, as well as the implant energy of the dopants, are selected depending on the type of transistor to be formed on the substrate 1. For instance, boron ions in NMOS and phosphorous ions in PMOS are implanted to form a halo punch-through suppression region in each device. Usually, boron is implanted at 90 keV with a dose of $2 \times 10^{13}$ cm$^{-2}$. Similar procedures are used for implanting phosphorous. A thermal treatment, such as an annealing step, is usually performed after the ion implantation step for diffusing dopants into the substrate.

As is apparent from FIG. 1*d*, the halo regions 5*h*, in correspondence with the edges of the polysilicon line 3 and the gate 6, extend outside the amorphous zones 5*a*. This is due to the fact that, during the implantation steps for forming the amorphous zones 5*a*, the ion beam is kept substantially perpendicular with respect to the surface of the substrate 1, so that the edges of these amorphous regions 5*a* are substantially aligned with the edges of the gate 6. Accordingly, ion channeling during the subsequent implantation steps for forming the halo structures 5*h* cannot be adequately controlled in the horizontal direction or, in other words, the doping profile of the halo regions 5*h* cannot be kept as shallow as desired in the horizontal direction but portions of the halo regions are formed extending beyond the amorphous regions 5*a*.

During a next step, as depicted in FIG. 1*c*, a third ion implantation step is carried out to form the source/drain extension regions 5'S and 5'D. To this end, by exposing the substrate 1 to an ion beam 7*e*, a dose of approximately $3 \times 10^{13} - 3 \times 10^{14}$ cm$^{-2}$ dopant ions is implanted at low energy (3 to 5 keV). This third ion implantation step is performed with N-type and P-type dopant materials for NMOS and PMOS devices, respectively. The problem arising during the halo implantation step of FIG. 1*b*, namely that ion channeling cannot be adequately controlled in the horizontal direction, arises during the ion implantation step of FIG. 1*c* as well. Accordingly, the source and drain regions 5'S and 5'D cannot be contained inside the amorphous regions 5*a* previously formed, but portions of the source and drain regions 5'S and 5'D extend beneath the layer 6 and the overlying polysilicon line 3, especially after a heat treatment process is performed. Accordingly, the doping profiles of the source and drain regions 5'S and 5'D cannot be kept as shallow as desired in the horizontal direction.

In particular, the situation after the implanting step of FIG. 1*c* is that depicted in enlarged view in FIG. 1*c'*, with the doping profiles of both the source and drain extension regions 5'S and the halo regions 5*h* extending beyond the doping profile of the amorphous regions 5*a*, in correspondence with the edges of the layer 6 and the overlying polysilicon line 3.

During a subsequent step, the source and drain regions 5S and 5D of the transistor 100 are completed, as depicted in FIG. 1*d*. In particular, dielectric sidewalls spacers 4 are formed on the sidewalls of the polysilicon line 3 according to well-known techniques and a further heavy implantation step is carried out for implanting dopants into those regions of the substrate not covered by the polysilicon line 3 and the sidewall spacers 4. At the end of the heavy implantation step, the source and drain regions 5S and 5D are formed to exhibit the desired dopant concentration. For NMOS and PMOS type devices, this heavy implantation step is performed using an N-type and P-type dopant material, respectively. The manufacturing process is then continued to complete the transistor 100 according to techniques well known to those skilled in the art.

As stated above, the pre-amorphization implanting process as depicted in FIG. 1*a* is performed for the purpose of controlling the ion channeling during the subsequent implanting steps to obtain doping profiles for both the halo structures and the source and drain regions that are as shallow as required in view of the reduced planar dimensions of modern transistors. That is, by pre-amorphizing the substrate, the dopants implanted into the substrate during subsequent implanting processes are confined to shallow regions of a reduced depth close to the surface of the substrate.

However, as stated above, the prior art pre-amorphization process as depicted with reference to FIG. 1*a* has the disadvantage that the ion channeling during subsequent implanting processes cannot be adequately controlled in the horizontal direction. Accordingly, the dopants implanted into the substrate during subsequent implanting processes may not be confined into shallow regions of predefined horizontal dimensions and the dopant concentration cannot be adequately controlled in correspondence with the channel edges. This, in particular, leads to reduced effective channel dimensions, with corresponding short channel effects, affecting the transistor.

Accordingly, in view of the problems explained above, it would be desirable to provide a technique that may solve or at least reduce one or more of these problems. In particular, it would be desirable to provide a technique that allows the prevention and/or reduction of ion channeling during halo implantation and source and drain implantation processes in both the vertical and the horizontal direction.

SUMMARY OF THE INVENTION

In general, the present invention is based on the consideration that ion channeling may be prevented or reduced in both the vertical and horizontal direction by performing a pre-amorphizing implantation step during which the substrate is exposed to an ion beam which is kept at a large tilt angle with respect to a direction perpendicular to the surface of the substrate.

For example, by performing a pre-amorphizing implantation step during which the ion beam is kept at a tilt angle of approximately 40 degrees, amorphous regions may be obtained extending partially beneath the gate insulation layer and the overlying polysilicon structure. This enables a good confinement of the following implantation steps in both the vertical and the horizontal direction. Accordingly, the dopants implanted into the substrate during subsequent implanting processes are confined to regions of both a reduced depth close to the surface of the substrate and predefined planar dimensions, with these shallow regions exhibiting a well-defined dopant concentration in both the vertical and horizontal direction.

Moreover, the present invention is based on the further consideration that ion channeling may be prevented or reduced in both the vertical and horizontal direction by performing an amorphizing implantation step during which the tilt angle is varied. For example, by dividing the amorphization implanting step into several periods and/or segments, amorphous regions of a predefined profile may be obtained, thus preventing ion channeling during subsequent implantation steps in both the vertical and horizontal direction, even if during these subsequent implantation steps the ion beam is tilted with respect to the surface of the substrate. For example, by dividing the amorphization step into several periods and/or segments, predefined regions of the substrate may be amorphized, depending on the tilt angles during the implantation periods, thus suppressing and/or minimizing the ion channeling which usually arises in these regions.

According to one embodiment, the present invention relates to a method of forming at least one field effect transistor on a semiconductive substrate. The method comprises forming at least one gate structure above an active region of the transistor and implanting ions of at least one dopant material through the portions of the surface of the substrate not covered by the gate structure by exposing the surface of the substrate to at least one ion beam of the dopant material so as to substantially amorphize the exposed portions of the surface to a predefined depth. Moreover, the ion beam is kept to a tilt angle with respect to a direction perpendicular to the surface of the substrate.

According to another embodiment, the present invention relates to a method of forming at least one field effect transistor on a semiconductive substrate. The method comprises forming at least one polysilicon gate structure above an active region of the transistor. Moreover, the method comprises implanting ions of at least a first dopant material during a first implantation step through the portions of the surface of the substrate not covered by the gate structure by exposing the surface of the substrate to at least one ion beam of the dopant material so as to substantially amorphize the exposed portions of the substrate to a predefined depth. The method further comprises implanting ions of a first predefined conductivity type during a second implantation step through the portions of the surface of the substrate not covered by the gate structure so as to form halo structures into the amorphized portions of the substrate. Moreover, during the first implantation step, the ion beam is kept at a tilt angle with respect to a direction perpendicular to the surface of the substrate.

According to a further embodiment of the present invention, a method of forming at least one field effect transistor on a semiconductive substrate is provided. The method comprises forming at least one gate structure above an active region of the transistor and implanting ions of at least one dopant material through the portions of the surface of the substrate not covered by the gate structure by exposing the surface of the substrate to at least one ion beam of the dopant material so as to substantially amorphize the exposed portions of the substrate to a predefined depth. Moreover, the tilt angle of the ion beam is varied with respect to a direction perpendicular to the surface of the substrate according to a predefined time schedule comprising a plurality of implanting periods and the tilt angle is kept within a predefined range during each implanting period.

According to another embodiment, the present invention relates to a method of forming at least one field effect transistor on a semiconductive substrate. The method comprises forming at least one polysilicon gate structure above an active region of the transistor. Furthermore, the method comprises implanting ions of at least a first dopant material during a first implantation step through the portions of the surface of the substrate not covered by the gate structure by exposing the surface of the substrate to at least one ion beam of the dopant material so as to substantially amorphize the exposed portions of the substrate to a predefined depth. The method further comprises implanting ions of a first predefined conductivity type during a second implantation step through the portions of the surface of the substrate not covered by the gate structure so as to form halo structures into the amorphized portions of the substrate. During the first implantation step, the tilt angle of the ion beam with respect to a direction perpendicular to the surface of the substrate is varied according to a predefined time schedule comprising a plurality of implanting periods and the tilt angle is kept within a predefined range during each implanting period.

BRIEF DESCRIPTION OF THE DRAWINGS

The invention may be understood by reference to the following description taken in conjunction with the accompanying drawings, in which like reference numerals identify like elements, and in which:

FIG. 1c' represents an enlarged view of the portion e depicted in FIG. 1c;

FIG. 2d' represents an enlarged view of the portion e depicted in FIG. 2d; and

Figure 1A:
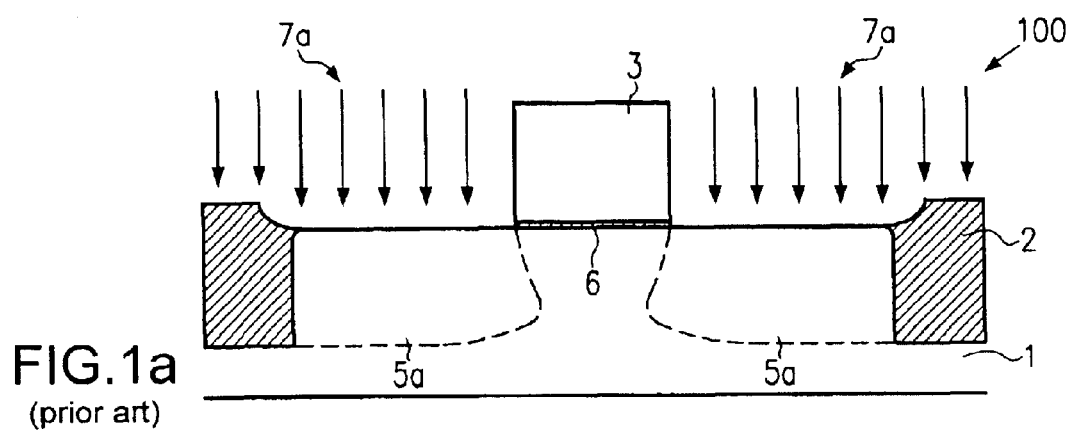
FIGS. 1a–1d represent a typical process sequence of a prior art method of forming the source and drain regions of a field effect transistor comprising the step of implanting ions to amorphize the substrate.
Figure 1B:
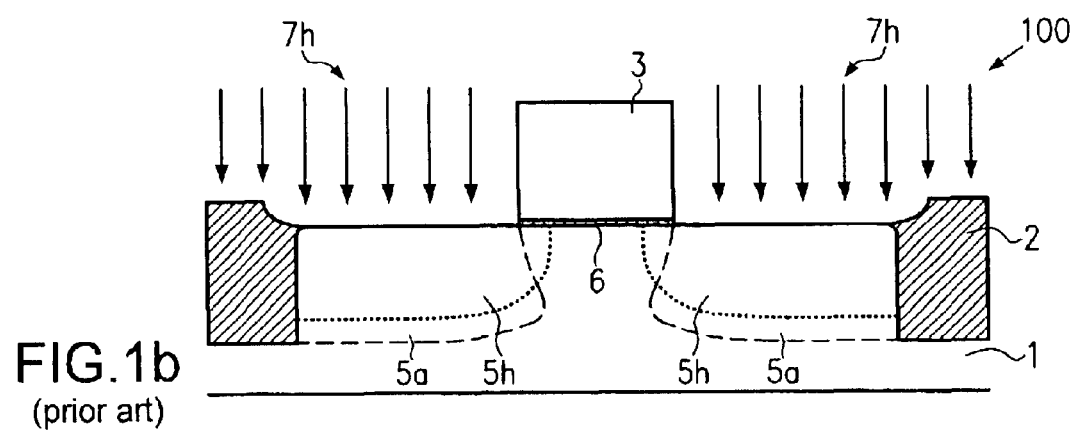
Figure 1C:
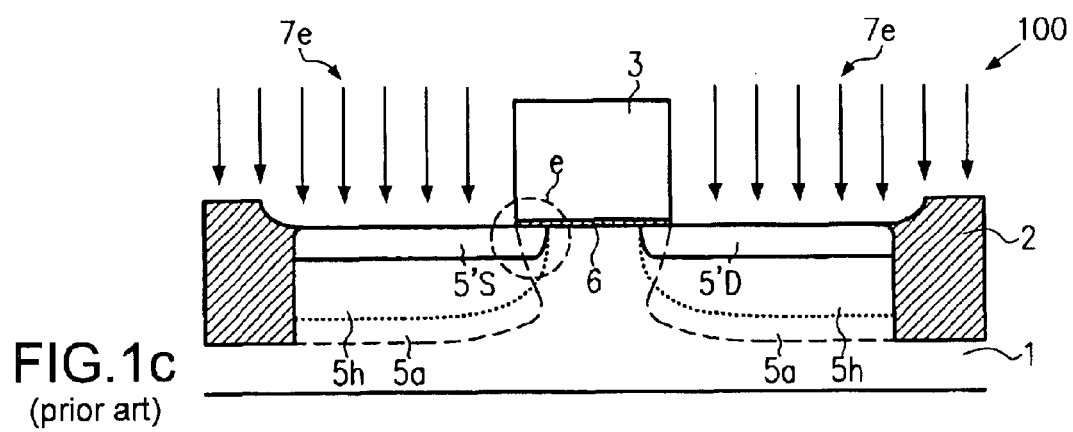
Figure 1C:
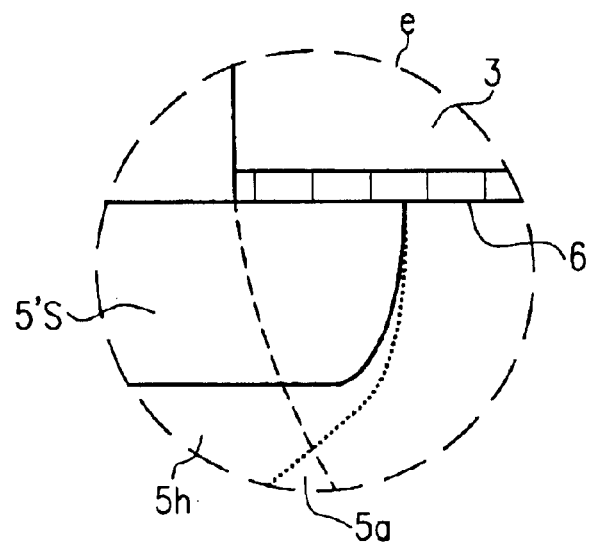

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present invention is understood to be of particular advantage when used for forming the active regions of field effect transistors. For this reason, examples will be given in the following in which corresponding embodiments of the present invention are applied to the formation of the active regions of a field effect transistor. However, it has to be noted that the use of the present invention is not limited to the formation of the active regions of field effect transistors, but, rather, the present invention can be used in any other situation in which the realization of shallow doping profiles in a substrate and/or a workpiece is required. The present invention can be carried out in all those situations in which it is required to control the ion channeling during ion implantation steps with the purpose of forming well-confined doping profiles exhibiting a reliable dopant concentration in both the vertical and the horizontal direction. The present invention can be carried out in all those situations in which optimum design of doped regions in a substrate is required. The present invention is therefore applicable in these situations and the source and drain regions of a field effect transistor depicted in the following illustrative embodiments are to represent any such portion and/or region of a substrate.

Figure 2D:
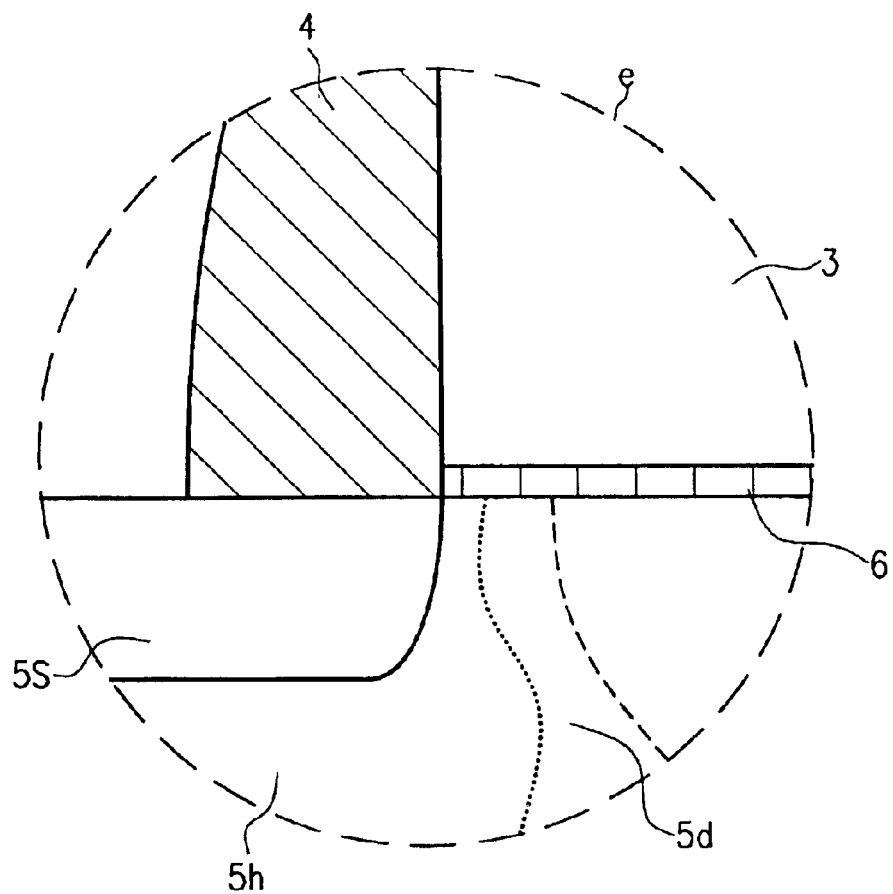
FIGS. 2a–2d represent a process sequence or a method of forming the source and drain regions of a field effect transistor comprising an amorphizing implantation process according to an illustrative embodiment of the present invention.
Figure 1D:
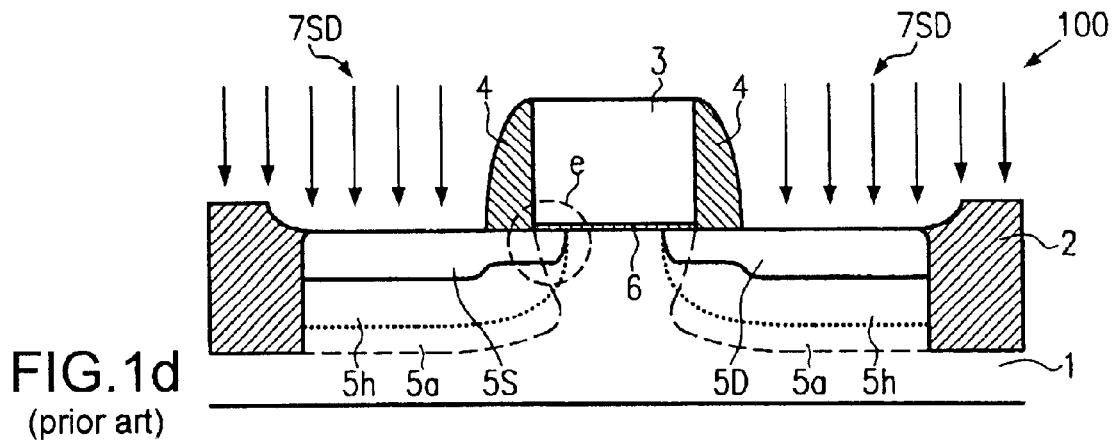
Figure 2A:
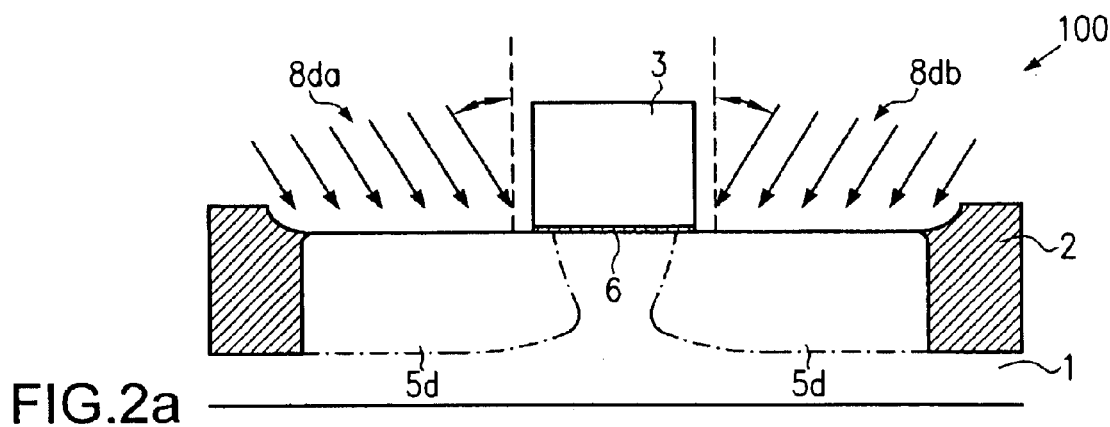

With reference to FIGS. 2a–2d, an illustrative embodiment of the amorphizing method of the present invention will now be described. In FIG. 2a, reference 1 relates to a substrate on which a field effect transistor 100 has to be formed, such as, for example, a PMOS, an NMOS, as used as a part of a CMOS pair. Reference 2 relates to isolation structures defining an active region of the transistor 100. The isolation structures 2 are provided as shallow trench isolation (STI) structures. However, other isolation structures, for example, LOCOS structures (local oxidation of silicon), could have been formed instead of STI structures. The isolation structures 2 essentially comprise an isolating material such as silicon dioxide, silicon nitride, or the like. Reference 3 relates to a polysilicon gate electrode, in the following also referred to as polysilicon gate line, formed on a gate insulation layer 6, patterned on the active region of the substrate 1. Moreover, in FIG. 2a, references 8da and 8db relate to corresponding ion beams to which the substrate 1 is exposed for the purpose of implanting ions through the portions of the surface of the substrate 1 not covered by the polysilicon line 3 and the underlying gate insulation layer 6 so as to damage the crystalline structure of the substrate 1. Finally, in FIG. 2a, reference 5d relates to regions of the substrate 1 in which the crystalline structure of the substrate has been damaged by exposing the substrate to the ion beams 8da and 8db. The regions 5d may either be continuous amorphous regions or may contain isolated crystal damages and/or non-overlapping amorphous regions, as will become more apparent in the following disclosure.

Figure 2B:
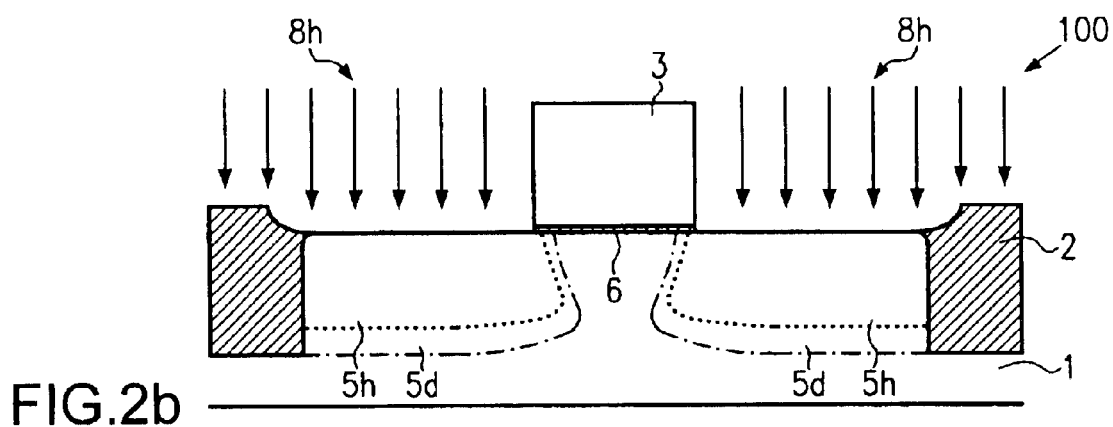
Figure 2C:
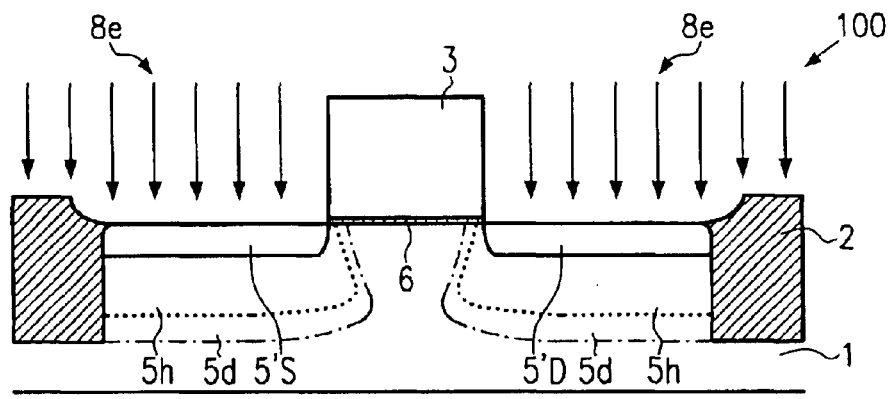
Figure 2D:
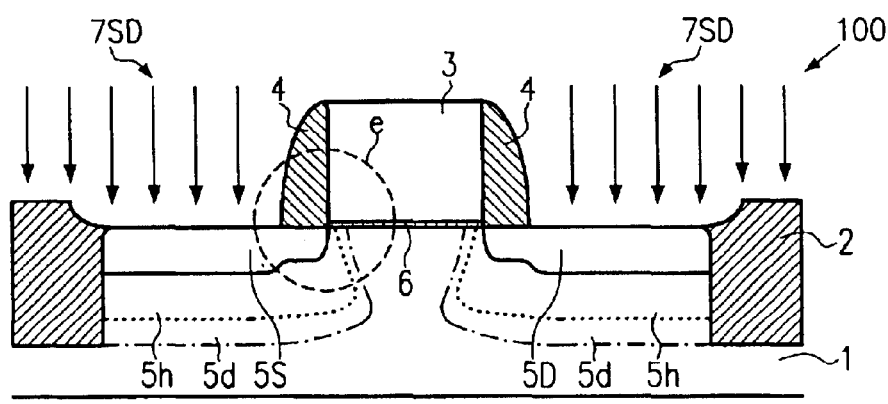

In FIGS. 2b–2d, the features already described with reference to FIG. 2a are identified by the same reference numerals. In FIG. 2b, reference 8h relates to an ion beam to which the substrate 1 is exposed for the purpose of implanting dopants into the substrate 1 so as to form halo structures into the damaged and/or amorphous regions 5d. These halo structures are identified in FIG. 2b by the reference numeral 5h and may include angled halo implants, although this is not shown in FIG. 2b.

In FIG. 2c, reference 8e identifies an ion beam to which the substrate 1 is exposed for the purpose of forming the source and drain extension regions of the transistor 100. These source and drain extension regions are identified in FIG. 2c by the reference numerals 5'S and 5'D, respectively.

In FIG. 2d, reference 7SD identifies a further ion beam to which the substrate 1 is exposed during a further implantation process for the purpose of forming the source and drain regions of the transistor 100, with these source and drain regions being identified by the reference numerals 5S and 5D, respectively. Usually, a heavy implantation step is carried out for determining the final concentration of the source and drain regions 5S and 5D. For NMOS and PMOS type devices, this heavy implantation step is performed using an N-type and a P-type dopant material, respectively.

The manufacturing process for the formation of the active region of the transistor 100 depicted in FIG. 2d may include the following steps. As is apparent from FIG. 2a, a polysilicon gate structure, including the polysilicon line 3 and the gate insulation layer 6, is formed first according to well-known techniques. The formation of the active regions normally starts after the polysilicon gate structure has been formed.

During a first implanting step according to the present invention, ions are implanted into the silicon substrate 1 so as to form amorphous regions 5d. For this purpose, the substrate 1 is exposed to an ion beam which is kept at a tilt angle with respect to a direction perpendicular to the surface of the substrate. In particular, a tilt angle may be selected between 10 and 80 degrees, depending on the circumstances. If the implantation is performed at a large tilt angle as depicted in FIG. 2a, the amorphous regions induced will extend well beneath the polysilicon gate structure. In contrast, when the implanting process is performed at an angle of about 10 degrees or less, the amorphous regions will not extend beneath the gate structure to any great extent. Since the ion beam is kept at a tilt angle with respect to the surface of the substrate, the implanting process usually comprises two semi-periods, wherein the substrate 1 is rotated 180 degrees about an axis perpendicular to the surface of the substrate at the end of the first semi-period and upon entering the second semi-period. That is, the substrate 1 is exposed to the same ion beam during the first and second semi-periods, and the ion beams 8da and 8db of FIG. 2a simply indicate that the substrate has been rotated 180 degrees.

Alternatively, the orientation of the ion beam may be varied at the end of the first semi-period and upon entering the second semi-period. In this case, the substrate 1 is exposed to two ion beams during the first and second semi-periods, respectively, and the ion beams 8da and 8db of FIG. 2a indicate that the ion beam has been rotated.

Typical implant elements are xenon or other heavy inert ions, such as germanium, silicon, argon, or combinations thereof, etc., at an implant energy in the range of approximately 50–150 keV.

Moreover, the amorphizing implantation step can be carried out so as to induce crystal damages and/or non-overlapping amorphous portions or the amorphizing implanting step can be carried out until these isolated amorphous portions overlap so that substantially uniform amorphous regions are formed. Typical implanting doses are in the range of approximately $1 \times 10^{11}$ cm$^2$ to $1 \times 10^{14}$ cm$^2$.

Since the ion beam is kept at a tilt angle with respect to the surface of the substrate, the amorphous regions 5d extend at least partially beneath the polysilicon gate structure. This provides a well-controlled suppression of the penetration depth both in lateral and vertical directions for subsequent implant steps of doping elements to form halo and source and drain regions. In other words, the subsequent implanting structures will exhibit an optimum profile tailoring and a predefined dopant concentration both in the vertical and in the horizontal direction.

Once the amorphous regions 5d have been formed as described above, the manufacturing process is continued to form halo regions into the substrate during a subsequent implantation step, as depicted in FIG. 2b. To this end, the substrate 1 is exposed to an ion beam 8h and dopants are implanted into the amorphous regions 5d through those portions of the surface of the substrate 1 not covered by the polysilicon gate structure. The ion beam 8h may be kept either perpendicular to the surface of the substrate (zero degrees tilt) or at a tilt angle with respect to the perpendicular to the surface of the substrate.

The halo regions 5h prevent, or at least reduce, the short channel effects, in particular the punch-through effect, in the transistor 100. The dopant concentration in the regions 5h, as well as the implant energy and the dopant, are selected depending on the type of transistor to be formed on the substrate 1. For instance, boron ions in NMOS and phosphorous ions in PMOS are implanted to form a halo punch-through suppression region in each device. Usually, phosphorous is implanted at 90 keV with a dose of $2 \times 10^{13}$ cm$^{-2}$ at 25 degrees tilt, in two segments, with the substrate rotated 180 degrees between the two segments. Similar procedures are used for implanting boron. A thermal treatment, such as an annealing step, is performed after the halo ion implantation step for diffusing the dopants into the substrate.

As stated above, due to the fact that the amorphous regions 5d have portions extending beneath the polysilicon gate structure, ion channeling during the halo implanting step can be well controlled both in the vertical and the horizontal direction. That is, only very small amounts of the halo dopants may penetrate and/or diffuse into the channel region of the transistor 100 in a non-controlled way, or the halo dopants may even substantially completely be prevented from entering the channel region, but the penetration of the halo dopants into the channel region will be controlled and kept within predefined limits. Accordingly, the halo regions 5h may exhibit a desired doping profile in a substantially optimum manner, thereby tailoring both in the vertical and the horizontal direction, i.e., the extension of the halo regions 5h into the substrate can be controlled in the vertical and in the horizontal direction and shallow halo structures can be obtained exhibiting a reliable dopant concentration.

The manufacturing process is then carried out to complete the transistor 100 according to techniques well known to those skilled in the art. In particular, during a next step, as depicted in FIG. 2c, a further ion implantation process is carried out for forming the source/drain extension regions 5'S and 5'D. To this end, a dose of approximately $3 \times 10^{13}$ to $3 \times 10^{14}$ cm$^{-2}$ dopant ions is implanted at low energy (3–5 keV) by exposing the substrate 1 to an ion beam 8e. Usually, N-type and P-type dopant materials are used for NMOS and PMOS devices, respectively.

The source and drain regions 5S and 5D of the transistor 100 are then completed during a subsequent step, as depicted in FIG. 2d. In particular, dielectric sidewall spacers 4 are formed first on the sidewalls of the polysilicon line 3 according to well known techniques, and a further heavy implantation step is carried out for implanting dopants into those regions of the substrate not covered by the polysilicon line 3 and the sidewall spacers 4. To this end, the substrate 1 is exposed to an ion beam 7SD which is usually kept substantially perpendicular with respect to the surface of the substrate 1. At the end of the heavy implantation step, the source and drain regions 5S and 5D are formed to exhibit a predefined dopant concentration. For NMOS and PMOS type devices, this heavy implantation step is performed using an N-type and P-type dopant material, respectively.

Also, in the case of the implanting steps depicted in FIGS. 2c and 2d for forming the source and drain extension regions and the source and drain regions, ion channeling is reduced because of the amorphous regions 5d previously formed according to the present invention. In particular, the situation after formation of the source and drain regions will be the one depicted in FIG. 2d' where there is depicted in an enlarged view the portion e defined by the dashed line in FIG. 2d. As is apparent from FIG. 2d', neither the source region 5S nor the halo region 5h extend horizontally beyond the amorphous region 5d. That is, penetration of the dopants in the horizontal direction is controlled as well as in the vertical direction. Shallow junctions are therefore formed and the dopant regions exhibit a predefined dopant concentration and an optimum doping profile tailoring.

Once the source and drain regions 5S and 5D have been formed, the manufacturing process is continued to complete the transistor 100 according to techniques well known to those skilled in the art.

With reference to FIGS. 3a–3d, a further illustrative embodiment of the method of the present invention for amorphizing a crystalline substrate will now be described. In FIGS. 3a–3d, the features already described with reference FIGS. 2a–2d are identified by the same reference numerals. Moreover, in FIGS. 3a–3c, references 8d11 and 8d12, 8d21 and 8d22, 8d31 and 8d32 relate to corresponding ion beams to which the substrate is exposed for the purpose of amorphizing the substrate. The tilt angles $\alpha$, $\beta$ and $\lambda$ of these ion beams differ from each other.

During the implanting process according to the present embodiment for amorphizing the substrate, the tilt angle between the ion beam and the surface of the substrate 1 is not kept constant but is varied during the implanting process according to a predefined time schedule. That is, the implanting process comprises several implanting periods and/or segments, and the tilt angle between the ion beam and the surface of the substrate is varied from each segment to the subsequent segment. In particular, by choosing a non-constant timing for the different periods (at different implant angles of the implant process), predefined portions of the substrate may be amorphized to suppress or minimize ion channeling arising in these regions during subsequent implanting processes.

Usually, the tilt angle may be varied between 10 and 80 degrees. By selecting a predefined time schedule, it becomes possible to realize amorphous zones having a particular shape. For instance, if the implanting with a tilt angle of about 80 degrees is prolonged, the amorphous regions will extend considerably beneath the polysilicon gate structure. On the other hand, if the implanting segment with a small tilt angle is prolonged, the amorphous regions will extend more in a vertical direction and less beneath the polysilicon gate structure.

Figure 3A:
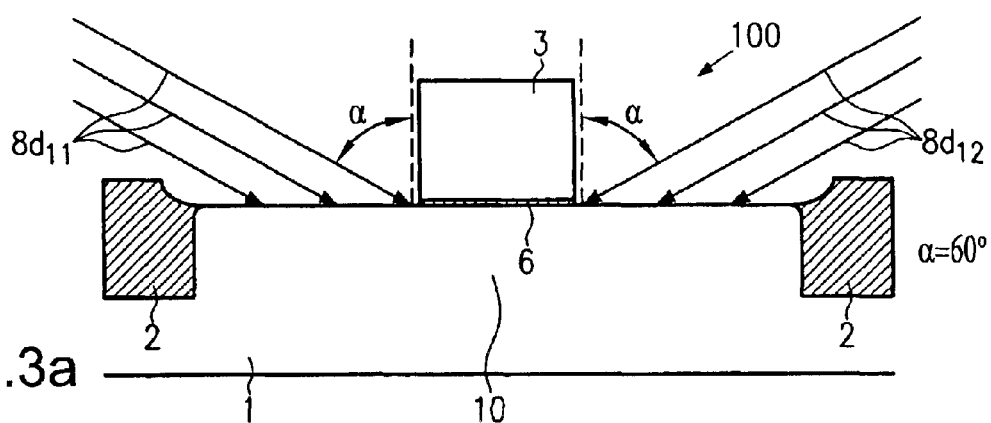
FIGS. 3a–3d represent an amorphizing implantation process according to a further illustrative embodiment of the present invention.
Figure 3B:
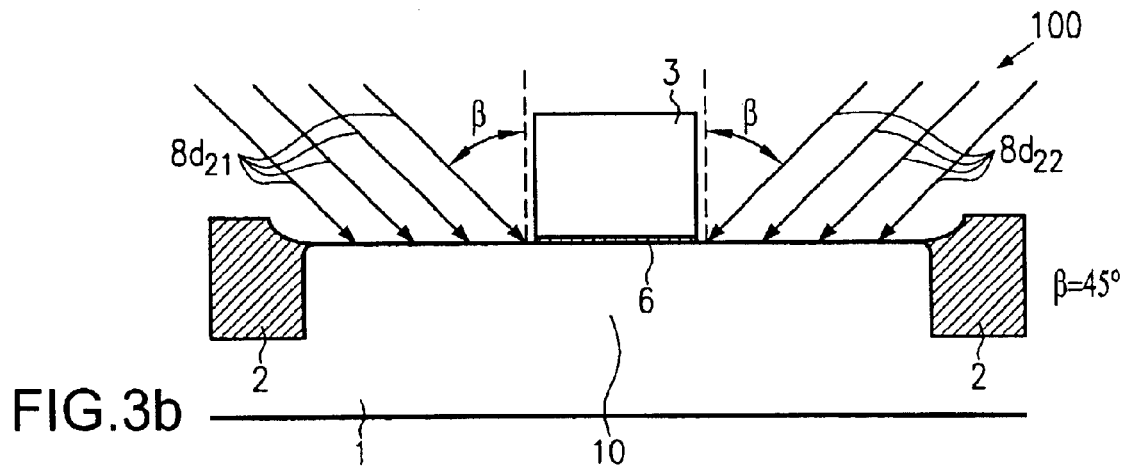
Figure 3C:
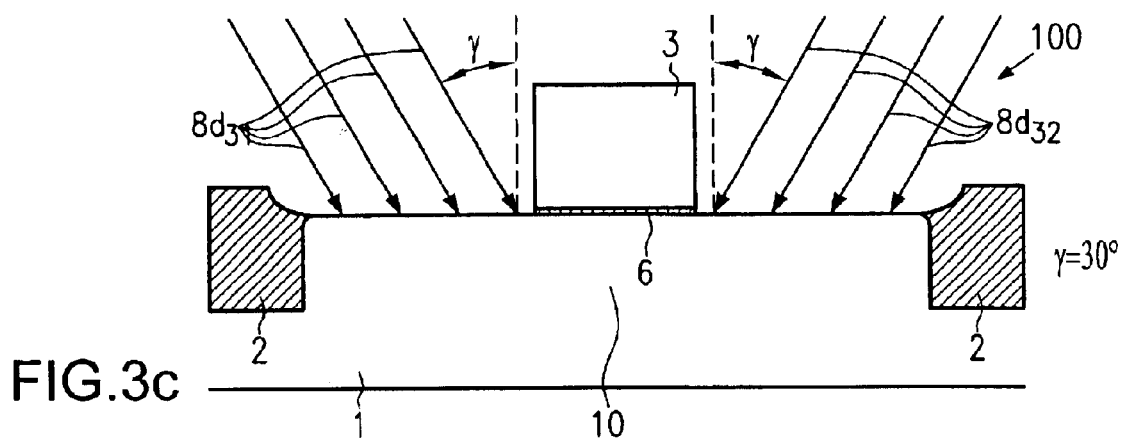

In the illustrative embodiment depicted in FIGS. 3a–3c, the method of implanting ions according to the present invention for amorphizing the substrate comprises three periods or segments. During a first period, as depicted in FIG. 3a, the ion beam is kept at a predefined tilted angle α with respect to a direction perpendicular to the surface of the substrate 1. In the particular example depicted in FIG. 3a, the angle α is about 60 degrees. The tilt angle α may either be kept substantially constant during the first implanting segment or it may be kept within a predefined range. The first implanting period may comprise two semi-periods, wherein the substrate is rotated 180 degrees about an axis perpendicular to the surface of the substrate at the end of the first semi-period and upon entering the second semi-period. In this case, the substrate is exposed to the same ion beam during the first and second semi-periods, and the ion beams 8d11 and 8d12 in FIG. 3a simply indicate that the substrate has been rotated 180 degrees. Alternatively, the orientation of the ion beam can be modified, for instance by rotating the ion beam source, so as to expose the substrate to two ion beams 8d11 and 8d12 during the first and second semi-periods.

The implanting process is then continued by varying the tilt angle and implanting dopants during a second implanting segment, as depicted in FIG. 3b. In the particular example of FIG. 3b, the tilt angle β is selected to about 45 degrees. Again, during the second period, the tilt angle β can either be kept constant or kept within a predefined range. Moreover, the length of the second period may be either different from the length of the first period or may correspond to the length of the first period. Moreover, the second implanting period may be divided into two semi-periods and either the substrate may be rotated 180 degrees or the ion beam source may be rotated. The ion beams 8d21 and 8d22 of FIG. 3b indicate that the implanting period is divided into two semi-periods.

The implanting process is then continued with a third tilt angle γ; in the particular example of FIG. 3c a tilt angle γ of about 30° has been selected for the ion beams 8d31 and 8d32. Again, the third implanting period may be divided into two semi-periods with either the substrate 1 being rotated approximately 180° upon entering the second semi-period or the orientation of the ion beam being modified. The total length of the third period may correspond to the length of one or both of the first and second period. Alternatively, the total length of the third period may differ from the length of the first and second periods.

Figure 3D:
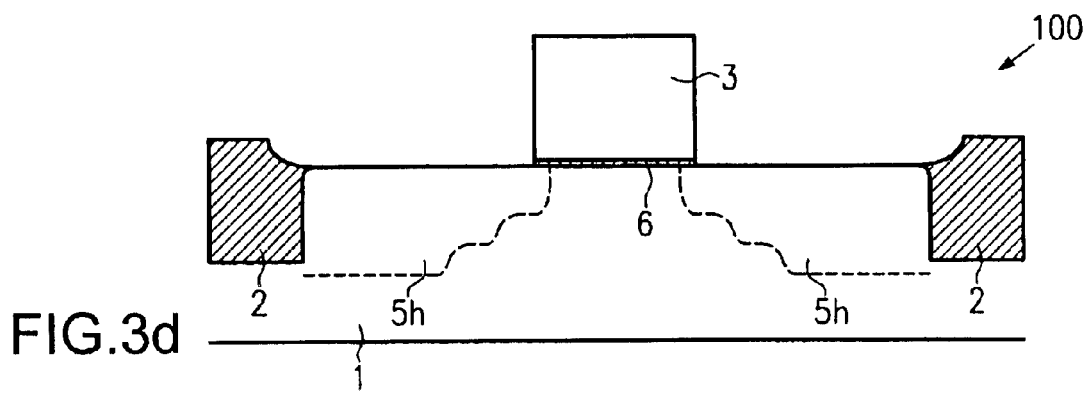

At the end of the implanting process, as depicted with reference to FIGS. 3a and 3d, the situation on the substrate will be the one depicted in FIG. 3d. In particular, as is apparent from FIG. 3d, the amorphous regions 5h exhibit a predefined shape depending on the time schedule selected for the amorphizing implantation process. Accordingly, the amorphizing implanting process as depicted above allows amorphizing those portions of the substrate in which the need arises to prevent ion channeling.

It has to be noted that any number of implanting periods can be selected. For instance, two to ten periods or more can be provided, depending on the final shape required for the amorphous regions to be formed in the substrate 1.

The advantages of using an amorphizing implantation process according to the present invention are based on the fact that ion channeling can be reduced and/or controlled during subsequent implanting processes both in the vertical and in the horizontal direction. This is accomplished by keeping the ion beam at a tilted angle between 10 and 80 degrees during the amorphizing implantation process. The tilt angle may either be kept constant during the implanting process or may be varied according to a predefined time schedule.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming at least one field effect transistor on a semiconductive substrate, the method comprising:

forming at least one gate structure above an active region of said at least one transistor;

implanting ions of at least one material through the portions of the surface of said substrate not covered by said at least one gate structure by exposing the surface of said substrate to at least one ion beam of said at least one material so as to substantially amorphize the exposed portions of said substrate to a predefined depth;

wherein the tilt angle of said ion beam with respect to a direction perpendicular to the surface of said substrate is varied according to a predefined time schedule comprising a plurality of implanting periods, and wherein said tilt angle is kept within a predefined range during each implanting period.

2. The method of claim 1, wherein said tilt angle may be varied in the range of approximately 10 to 80 degrees.

3. The method of claim 1, wherein said at least one material comprises heavy inert ions.

4. The method of claim 3, wherein said heavy inert ions comprise one of xenon, germanium, silicon, argon, or a combination thereof.

5. The method of claim 1, wherein said implanting periods have different lengths.

6. The method of claim 1, wherein said tilt angle is kept substantially constant during each implanting period.

7. The method of claim 1, wherein the implanting energy is varied according to the predefined time schedule and wherein, during each implanting period, the implanting energy is kept within a predefined range.

8. The method of claim 7, wherein said implanting energy is varied in the range of approximately 50–150 keV.

9. The method of claim 1, wherein the implanting dose is varied according to said predefined time schedule and wherein the implanting dose is kept within a predefined range during each implanting period.

10. The method of claim 9, wherein said implanting dose is varied in the range of approximately $1 \times 10^{11}/cm^2$ to $1 \times 10^{14}/cm^2$.

11. The method of claim 1, wherein said semiconductive substrate comprises one of silicon and germanium.

12. The method of claim 1, wherein said field effect transistor is one of an NMOS and a PMOS transistor.

13. The method of claim 1, wherein said substrate is rotated approximately 180 degrees about an axis substantially perpendicular to said surface at least once during each implanting period.

14. A method of forming at least one field-effect transistor on a semiconductive substrate, the method comprising:

forming at least one gate structure above an active region of said at least one transistor;

implanting ions of at least a first material during a first implantation step through the portions of the surface of said substrate not covered by said gate structure by exposing the surface of said substrate to at least one ion beam of said at least one material so as to substantially amorphize the exposed portions of said substrate to a predefined depth;

implanting ions of a first predefined conductivity type during a second implantation step through the portions of the surface of said substrate not covered by said gate structure so as to form halo structures into the amorphized portions of said substrate;

wherein during said first implantation step the tilt angle of said ion beam with respect to a direction perpendicular to the surface of said substrate is varied according to a predefined time schedule comprising plurality of implanting periods, and wherein said tilt angle is kept within a predefined range during each implanting period.

15. The method of claim 14, wherein during said first implantation step said tilt angle may be varied in the range of approximately 10 to 80 degrees.

16. The method of claim 14, wherein said at least one material comprises heavy inert ions.

17. The method of claim 16, wherein said heavy inert ions comprise one of xenon, germanium, silicon, argon, or a combination thereof.

18. The method of claim 14, wherein said implanting periods have different lengths.

19. The method of claim 14, wherein the tilt angle is substantially kept constant during each implanting period.

20. The method of claim 14, wherein during said first implantation step the implanting energy is varied according to said predefined time schedule and wherein during each implanting period the implanting energy is kept within a predefined range.

21. The method of claim 20, wherein said implanting energy may be varied in the range of approximately 50–150 keV.

22. The method of claim 14, wherein during said first implantation step the implanting dose is varied according to said predefined time schedule and wherein the implanting dose is kept within a predefined range during each implanting period.

23. The method of claim 22, wherein said implanting dose may be varied in the range of approximately $1 \times 10^{11}/cm^2$ to $1 \times 10^{14}/cm^2$.

24. The method of claim 14, wherein said semiconductive substrate comprises one of silicon and germanium.

25. The method of claim 14, further comprising implanting ions of a second predefined conductivity type opposed to said first conductivity type during a third implantation step into the amorphized portions of said substrate.

26. The method of claim 25, further comprising:

forming spacer elements adjacent to a portion of the sidewalls of said gate structure; and implanting ions of a predefined conductivity type corresponding to one of said first and second conductivity types during a fourth implantation step through at least the portions of said surface not covered by said gate structures and said spacer elements.

27. The method of claim 14, wherein said field effect transistor is one of an NMOS and a PMOS transistor.

28. The method of claim 14, wherein during said first implantation step said substrate is rotated approximately 180 degrees about an axis substantially perpendicular to said surface at least once during each implanting period.

* * * * *